United States Patent
Li et al.

(10) Patent No.: US 6,215,694 B1
(45) Date of Patent: Apr. 10, 2001

(54) SELF-RESTORING SINGLE EVENT UPSET (SEU) HARDENED MULTIPORT MEMORY CELL

(75) Inventors: Bin Li, Fairfax; Livia L. Zien; David C. Lawson, both of Fredericksburg; Tatia B. Butts, Manassas; Tri M. Hoang, Clifton, all of VA (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 09/553,595

(22) Filed: Apr. 20, 2000

Related U.S. Application Data

(60) Provisional application No. 60/136,478, filed on May 28, 1999.

(51) Int. Cl.⁷ .................................................. G11C 11/00
(52) U.S. Cl. ..................................... 365/156; 365/230.05
(58) Field of Search ............................ 365/230.05, 156, 365/154, 190, 189.04, 189.05

(56) References Cited

U.S. PATENT DOCUMENTS

| | | | |
|---|---|---|---|
| 4,873,665 | * 10/1989 | Jiang | 365/154 |
| 5,150,326 | * 9/1992 | Aoki | 365/156 |
| 5,157,625 | 10/1992 | Barry . | |
| 5,189,640 | 2/1993 | Huard . | |
| 5,311,070 | 5/1994 | Dooley . | |
| 5,481,495 | * 1/1996 | Henkels | 365/189.02 |

* cited by examiner

Primary Examiner—A. Zarabian
(74) Attorney, Agent, or Firm—Anthony P. Ng; Bracewell & Patterson, L.L.P.

(57) ABSTRACT

A single event upset hardened multiport memory cell to be utilized in a register file is disclosed. The single event upset hardened multiport memory cell includes a storage cell, a write bitline, a read bitline. The storage cell, which is utilized for storing data, includes first and second sets of cross-coupled transistors and first and second sets of isolation transistors. The first and second sets of isolation transistors are respectively coupled to the first and second set of cross-coupled transistors such that two inversion paths are formed between the two sets of cross-coupled transistors and the two sets of isolation transistors. Coupled to the storage cell, the write bitline inputs write data to the storage cell. Also coupled to the storage cell, the read bitline outputs read data from the storage cell.

25 Claims, 6 Drawing Sheets

SELF-RESTORING SINGLE EVENT UPSET (SEU) HARDENED MULTIPORT MEMORY CELL

RELATED PATENT APPLICATIONS

The present patent application is related to a provisional application Ser. No. 60/136,478, filed on May. 28, 1999, a copending application U.S. Ser. No. 09/441,941, filed on Nov. 17, 1999, entitled "METHOD AND APPARATUS FOR HARDENING A STATIC RANDOM ACCESS MEMORY CELL FROM SINGLE EVENT UPSETS, and a copending application U.S. Ser. No. 09/441,942, filed on Nov. 17, 1999, entitled "SINGLE EVENT UPSET (SEU) HARDENED STATIC RANDOM ACCESS MEMORY CELL".

BACKGROUND OF THE INVENTION

1. Technical Field

The present invention relates to integrated circuits in general, and in particular to mutiport memory cell circuits. Still more particularly, the present invention relates to a single event upset hardened mutiport memory cell.

2. Description of the Prior Art

Multiport memories are random access memories that have multiple ports to enable parallel accesses, such as simultaneously reading a first memory location via a first port and writing a second memory location via a second port. Typically, multiport memories find their applications within integrated circuit devices as register files. A register file is a temporary buffer for storing intermediate results (and arguments) that are produced and used by various functional parts of an integrated circuit device, as it is well-known to those skilled in the relevant art.

In certain environments, such as satellite orbital space, in which the level of radiation is relatively intense, integrated circuit devices that utilize static random access memories (SRAMs) as memory cells for a storage element, such as a register file, are more susceptible to single event upsets (SEUs) or soft errors. These SEUs are typically caused by electron-hole pairs created by, and travelling along the path of, a single energetic particle as it passes through the SRAM cells. Should the energetic particle generate a critical charge within a storage node of an SRAM cell, the logic state of the SRAM cell will be upset, and erroneous results may be generated.

SUMMARY OF THE INVENTION

In accordance with a preferred embodiment of the present invention, a single event upset hardened register file cell includes a storage cell, one or a pair of write bitlines, one or a pair of read bitlines. The storage cell, which is utilized for storing data, includes first and second sets of cross-coupled transistors and first and second sets of isolation transistors. The first and second sets of isolation transistors are respectively coupled to the first and second set of cross-coupled transistors such that two inversion paths are formed between the two sets of cross-coupled transistors and the two sets of isolation transistors. Coupled to the storage cell, the write bitline inputs write data to the storage cell. Also coupled to the storage cell, the read bitline outputs read data from the storage cell.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

The present invention is illustrated with complementary metal oxide semiconductor (CMOS) integrated circuits, though other types of processing technology may also be applicable.

Figure 1:
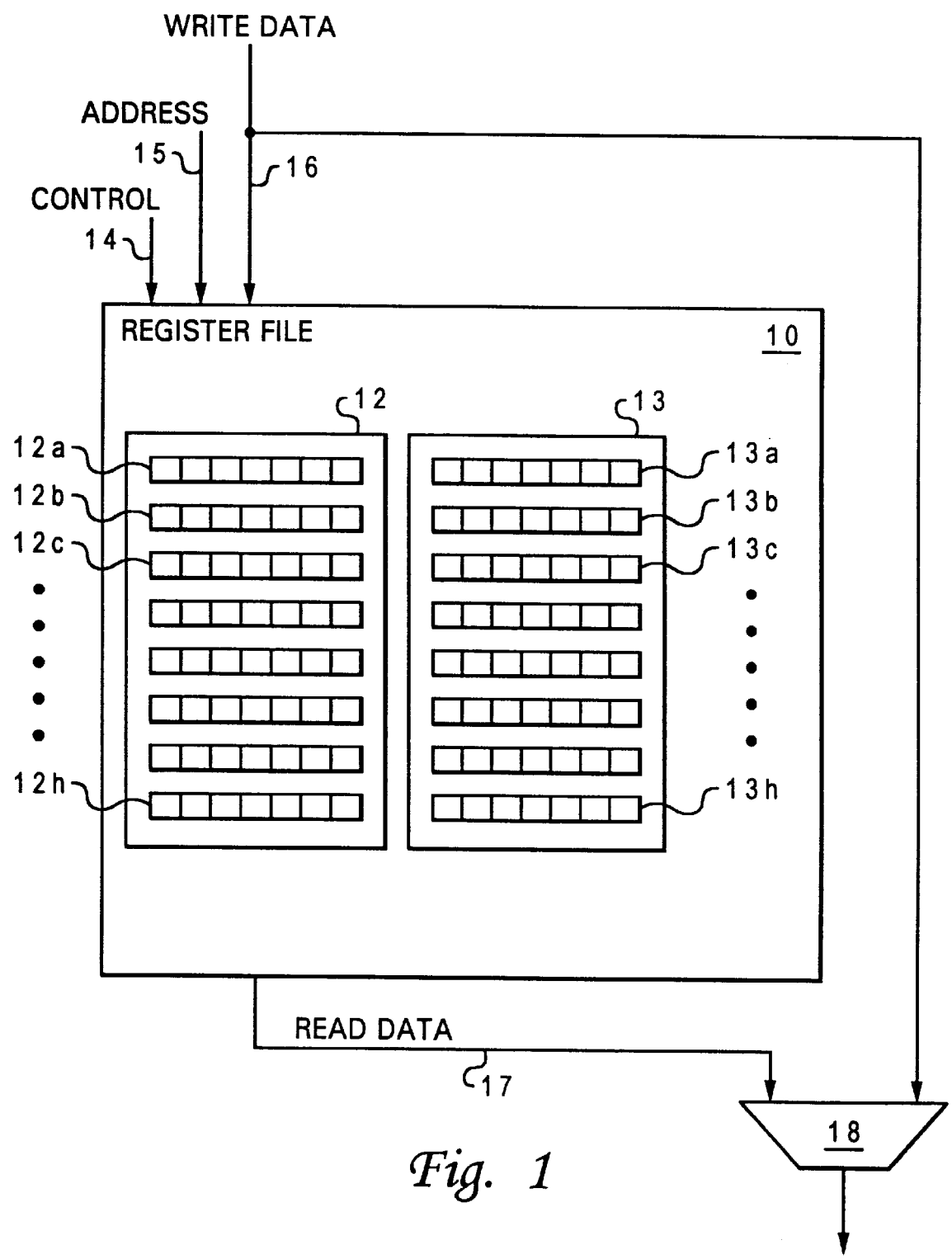
FIG. 1 is a block diagram of a register file in accordance with a preferred embodiment of the present invention.

Referring now to the drawings and in particular to FIG. 1, there is illustrated a block diagram of a register file in accordance with a preferred embodiment of the present invention. As shown, a register file 10 includes a number of registers 12a–12h and 13a–13h, which may be organized into banks 12 and 13, respectively. Each of registers 12a–12h and 13a–13h contains multiple register file cells, each register file cell storing one bit of data. A control circuit (not shown) may be used to write data into register file 10 by providing the data to be written on a data bus 16, a register address (or other identifier of a register) on an address bus 15, and control signals on a control bus 14. The same control circuit may also be used to read data from register file 10 by providing a register address on address bus 15 along with control signals on control bus 14, and the data is read from data bus 17. The write data and the read data can be multiplexed via a multiplexor 18, to be further utilized by other circuitry within an integrated circuit.

Figure 2:
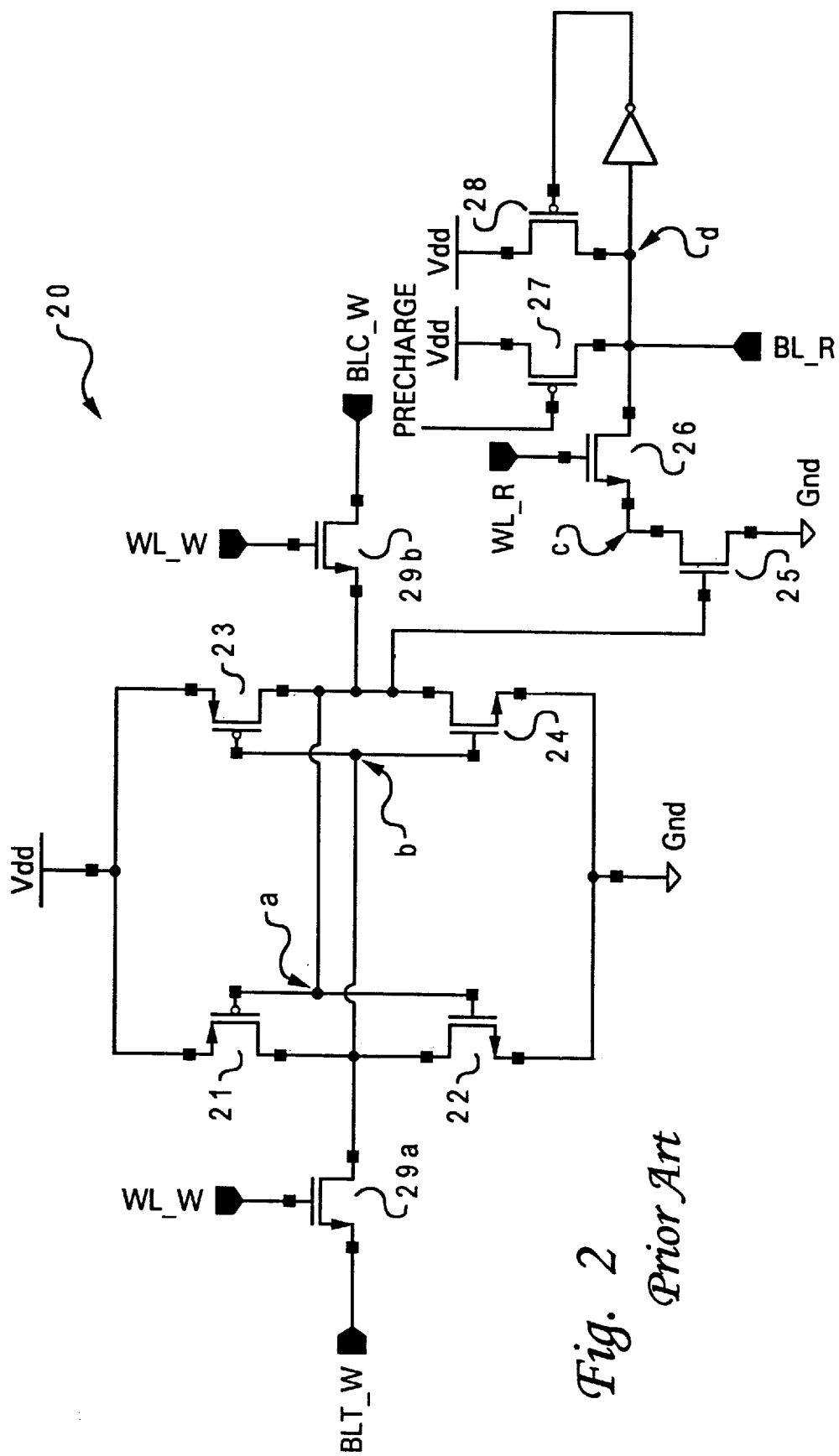
FIG. 2 is a schematic diagram of a register file cell within the register file from FIG. 1, in accordance with the prior art.

With reference now to FIG. 2, there is depicted a schematic diagram of a register file cell within register file 10, in accordance with the prior art. As shown, register file cell 20 includes p-channel transistors 21, 23 and n-channel transistors 22, 24. Transistors 21 and 22 are connected in series, with the source of transistor 21 connected to a power supply, $V_{dd}$, and the source of transistor 24 connected to ground. Similarly, transistors 23 and 24 are connected in series, with the source of transistor 23 connected to $V_{dd}$ and the source of transistor 24 connected to ground. In addition, transistors 21 and 22 are cross-coupled to transistors 23 and 24.

Also shown in FIG. 2 are two n-channel pass transistors 29a and 29b. Pass transistor 29a, having its gate connected to a write wordline WL_W, is coupled between a write bitline BLT_W and a node b. Similarly, pass transistor 29b, also having its gate connected to write wordline WL_W, is coupled between a write bitline BLC_W and a node a. The voltage signal on write bitline BLT_W is complementary to the voltage signal on write bitline BLC_W. In addition, a transistor 26, having its gate connected to a read wordline WL_R, is coupled to transistor 24 via a transistor 25.

Further, the drain of transistors 27 and 28 are connected to read bitline BL_R. The gate of transistor 27 is controlled by a precharged signal, and the gate of transistor 28 is connected to its drain via an inverter.

If the storage cell contains a high logical state, transistor 25 will be turned on, driving node c to a low voltage. However, if the storage cell contains a low logical state, transistor 25 remains off, so the read bitline (BL_R) relies on the precharged state to hold the data at node d.

The problem with register file cell 20 is that in its present configuration, nodes a, b, c, and d are very susceptible to single event upsets (SEUs) or soft errors. Several improvements can be made on register file cell 20 in order to improve its overall SEU hardness, and these improvements are described as follows.

Figure 3:
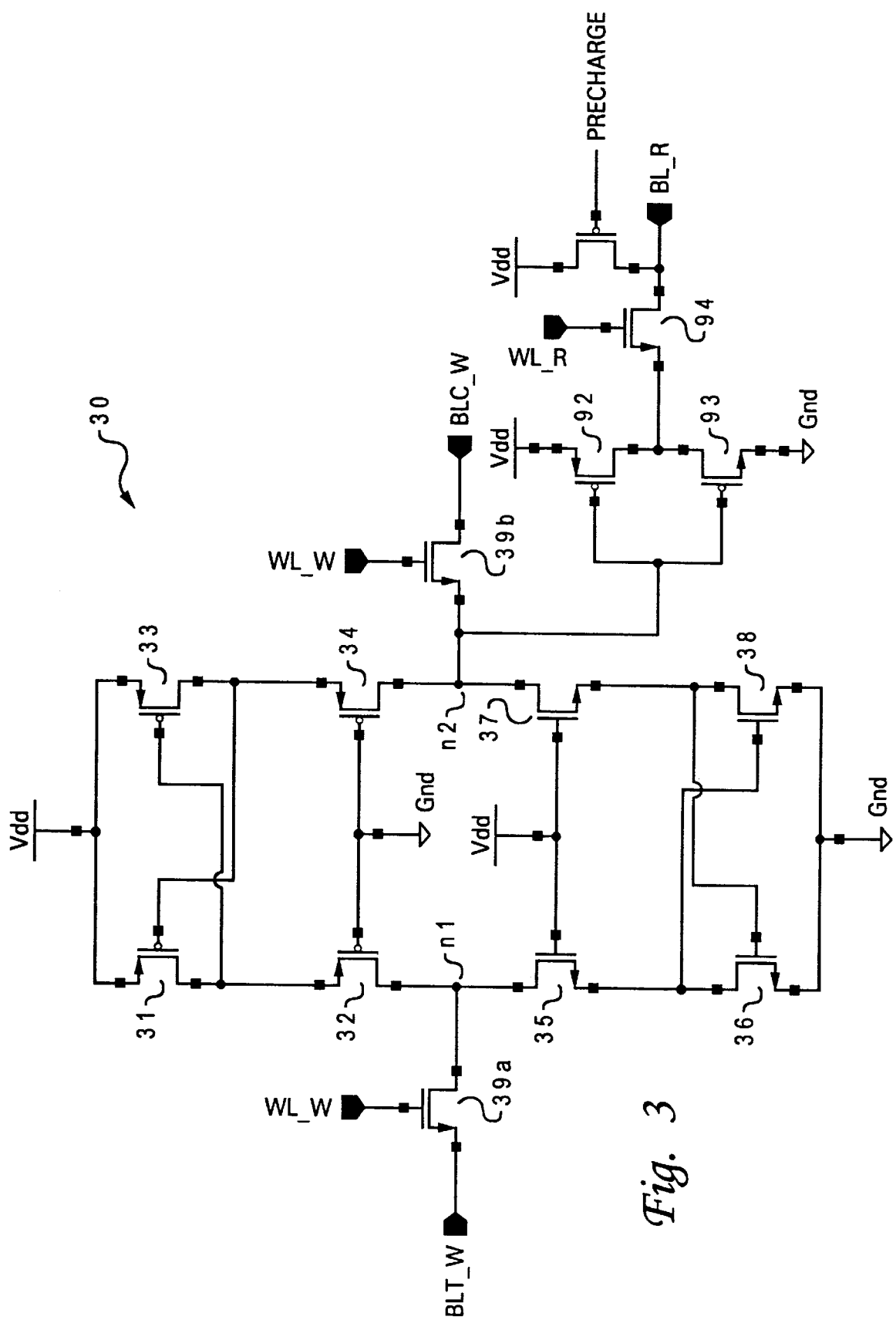
FIG. 3 is a schematic diagram of a register file cell within the register file from FIG. 1, in accordance with a preferred embodiment of the present invention.

Referring now to FIG. 3, there is depicted a schematic diagram of a register file cell within register file 10, in accordance with a preferred embodiment of the present invention. As shown, register file cell 30 includes p-channel transistors 31–34 and n-channel transistors 35–38. Transistors 31, 32, 35, and 36 are connected in series, with the source of transistor 31 connected to a power supply, $V_{dd}$, and the source of transistor 36 connected to ground. Similarly, transistors 33, 34, 37, and 38 are connected in series, with the source of transistor 33 connected to $V_{dd}$ and the source of transistor 38 connected to ground.

Furthermore, transistors 31, 32 are cross-coupled to transistors 33, 34, and transistors 35, 36 are cross-coupled to transistors 37, 38. The gates of transistors 32 and 34 are connected to a low voltage such as ground, and the gates of transistors 35 and 37 are connected to a high voltage such as a power supply, $V_{dd}$. Transistor 32 functions as an isolation transistor for transistor 31, and transistor 34 functions as an isolation transistor for transistor 33. Similarly, transistor 35 functions as an isolation transistor for transistor 36, and transistor 37 functions as an isolation transistor for transistor 38. As a result, two inversion paths are formed. The first inversion path includes transistors 31, 34, 37, and 36; and the second inversion path includes transistors 33, 32, 35, and 38.

Also shown in FIG. 3 are two n-channel pass transistors 39a and 39b. Pass transistor 39a, having its gate connected to a write wordline WL_W, is coupled between a write bitline BLT_W and a node n1. Similarly, pass transistor 39b, also having its gate connected to write wordline WL_W, is coupled between a write bitline BLC_W and a node n2. The voltage signal on write bitline BLT_W is complementary to the voltage signal on write bitline BLC_W. When enabled, pass transistors 39a and 39b allow data to be written into node n1 and node n2 from bitlines BLT_W and BLC_W, respectively. Pass transistor 39a, 39b are enabled by wordline WL_W, which has a state that is a function of the row address in register file 10, as is understood by those skilled in the relevant art.

In addition, a transistor 94, having its gate connected to a read wordline WL_R, is connected between a read bitline BL_R and node n4 via an inverter that includes a p-channel transistor 92 and an n-channel transistor 93. When enabled, transistor 94 allows data to be read from node n2 of register file cell 30 to bitlines BL_R. Transistor 94 is enabled by read wordline WL_R, which has a state that is a function of the row address in register file 10, as is understood by those skilled in the relevant art.

During a write operation, the voltages of nodes n1 and n2 are logical complements of one another. When write wordline WL_W is energized by the row decoder according to the row address received, pass transistors 39a and 39b will be turned on, coupling nodes n1 and n2 to write bitlines BLT_W and BLC_W, respectively. Accordingly, when wordline WL_W is high, the state of register file cell 10 can establish a differential voltage on BLT_W and BLC_W. The sizes of transistors 31–34 and 35–38 are generally chosen such that when pass transistors 39a and 39b are turned on by write wordline WL_W, a differentially low voltage at write bitline BLT_W with respect to write bitline BLC_W can force node n2 to a logic high state, and a differentially low voltage at write bitline BLC_W with respect to write bitline BLT_W can force node n1 to a logic high state. In addition, the sizes of transistors 31–34 and 35–38 are also chosen such that when pass transistors 39a and 39b are turned on by write wordline WL_W, a differentially high voltage at write bitline BLT_W with respect to write bitline BLC_W will not force node n2 high, nor will a differentially high voltage at write bitline BLC_W with respect to write bitline BLT_W force node n1 high. Therefore, writing into register file cell 30 is accomplished by "pulling" the desired bit line and thus the desired side of register file cell 30 at either node n1 or node n2 low, which in turn (due to feedback paths in register file cell 30) causes the opposite side of register file cell 30 to have a logic high state.

During a read operation, read wordline WL_R is energized by the row decoder according to the row address received, and transistor 94 will be turned on. As such, the data in node n2 is sent to read bitline BL_R.

Figure 4:
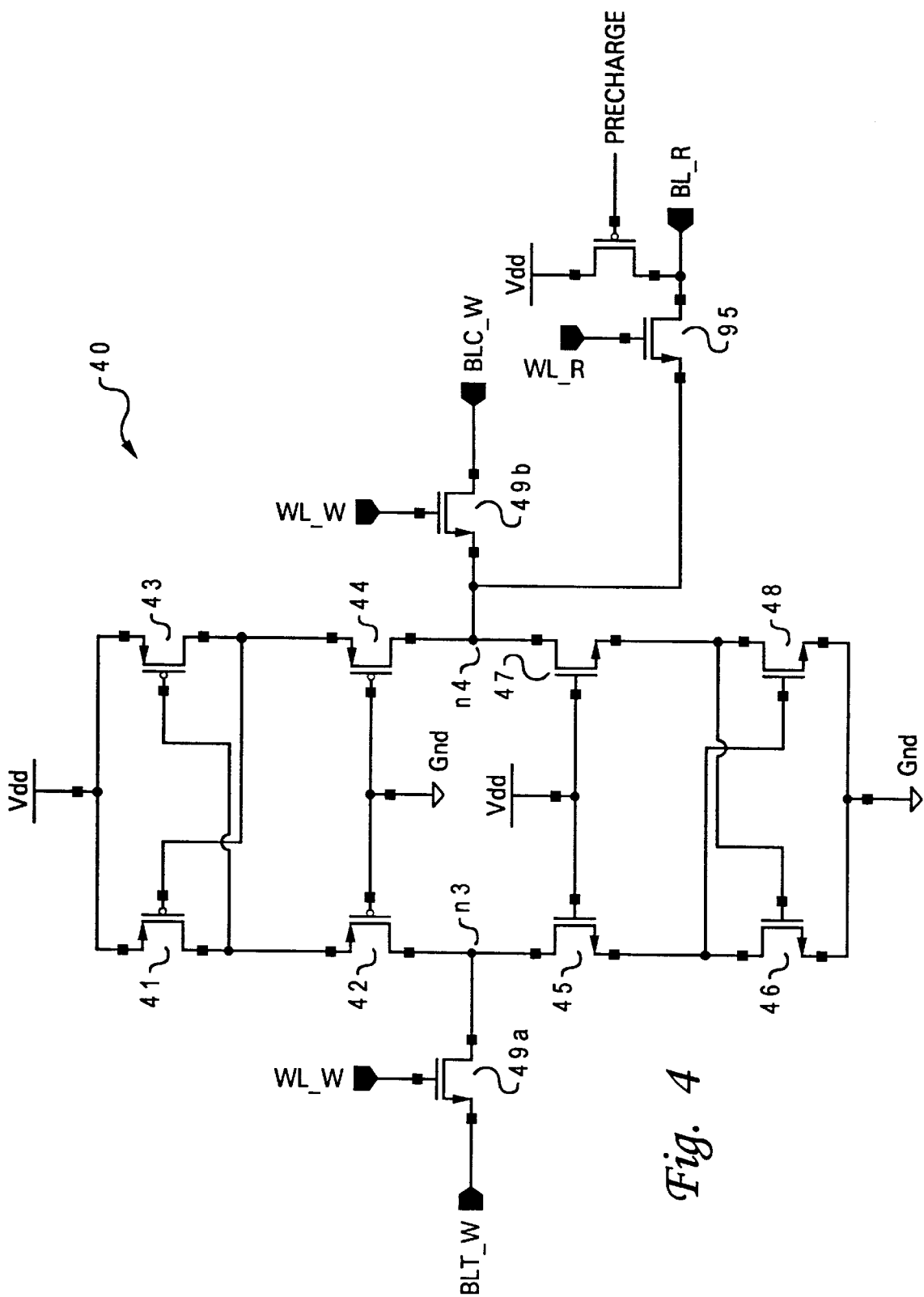
FIG. 4 is a schematic diagram of a register file cell within the register file from FIG. 1, in accordance with an alternative embodiment of the present invention.

With reference now to FIG. 4, there is depicted a schematic diagram of a register file cell within register file 10, in accordance with an alternative embodiment of the present invention. As shown, a register file cell 40 includes p-channel transistors 41–44 and n-channel transistors 45–48. Transistors 41, 42, 45, and 46 are connected in series, with the source of transistor 41 connected to a power supply, $V_{dd}$, and the source of transistor 46 connected to ground. Similarly, transistors 43, 44, 47, and 48 are connected in series, with the source of transistor 43 connected to $V_{dd}$ and the source of transistor 48 connected to ground.

Transistors 41, 42 are cross-coupled to transistors 43, 44, and transistors 45, 46 are cross-coupled to transistors 47, 48. For transistors 41–44, the cross-coupling is accomplished by connecting the gate of transistor 41 to a node between transistors 43 and 44, and by connecting the gate of transistor 43 to a node between transistors 41 and 42. For transistors 45–48, the cross-coupling is accomplished by connecting the gate of transistor 46 to a node between transistors 47 and 48, and by connecting the gate of transistor 48 to a node between transistors 45 and 46.

Furthermore, the gates of transistors 42 and 44 are connected to a low voltage such as ground. Thus, transistor 42 functions as an isolation transistor for transistor 41, and transistor 44 functions as an isolation transistor for transistor 43. As a result, two inversion paths are formed among transistors 41–42 and 43–44. The first inversion path includes transistors 41, 44, and 42; and the second inversion path includes transistors 43, 42, and 44. In addition, the gates of transistors 45 and 47 are connected to a high voltage such as a power supply. Thus, transistor 45 functions as an isolation transistor for transistor 46, and transistor 47 functions as an isolation transistor for transistor 48. Similarly, two inversion paths are formed among transistors 45–46 and 47–11 48. The first inversion path includes transistors 46, 47, and 45; and the second inversion path includes transistors 48, 45, and 47.

Also shown in FIG. 4 are two n-channel pass transistors 49a and 49b. Pass transistor 49a, having its gate connected to a write wordline WL_W, is coupled between a write bitline BLT_W and a node n3. Similarly, pass transistor 29b, also having its gate connected to write wordline WL_W, is coupled between a write bitline BLC_W and a node n4. The voltage signal on write bitline BLT_W is complementary to the voltage signal on write bitline BLC_W. When enabled, pass transistors 49a and 49b allow data to be written in node n3 and node n4 from bitlines BLT_W and BLC_W, respectively. Pass transistors 49a, 49b are enabled by write wordline WL_W, which has a state that is a function of the row address in register file 10, as is understood by those skilled in the relevant art.

In addition, a transistor 95, having its gate connected to a read wordline WL_R, is connected between n4 and a read bitline BL_R. When enabled, transistor 94 allows data to be read from node n4 of register file cell 10 to bitlines BL_R. Transistor 94 is enabled by read wordline WL_R, which has a state that is a function of the row address in register file 40, as is understood by those skilled in the relevant art.

Figure 5:
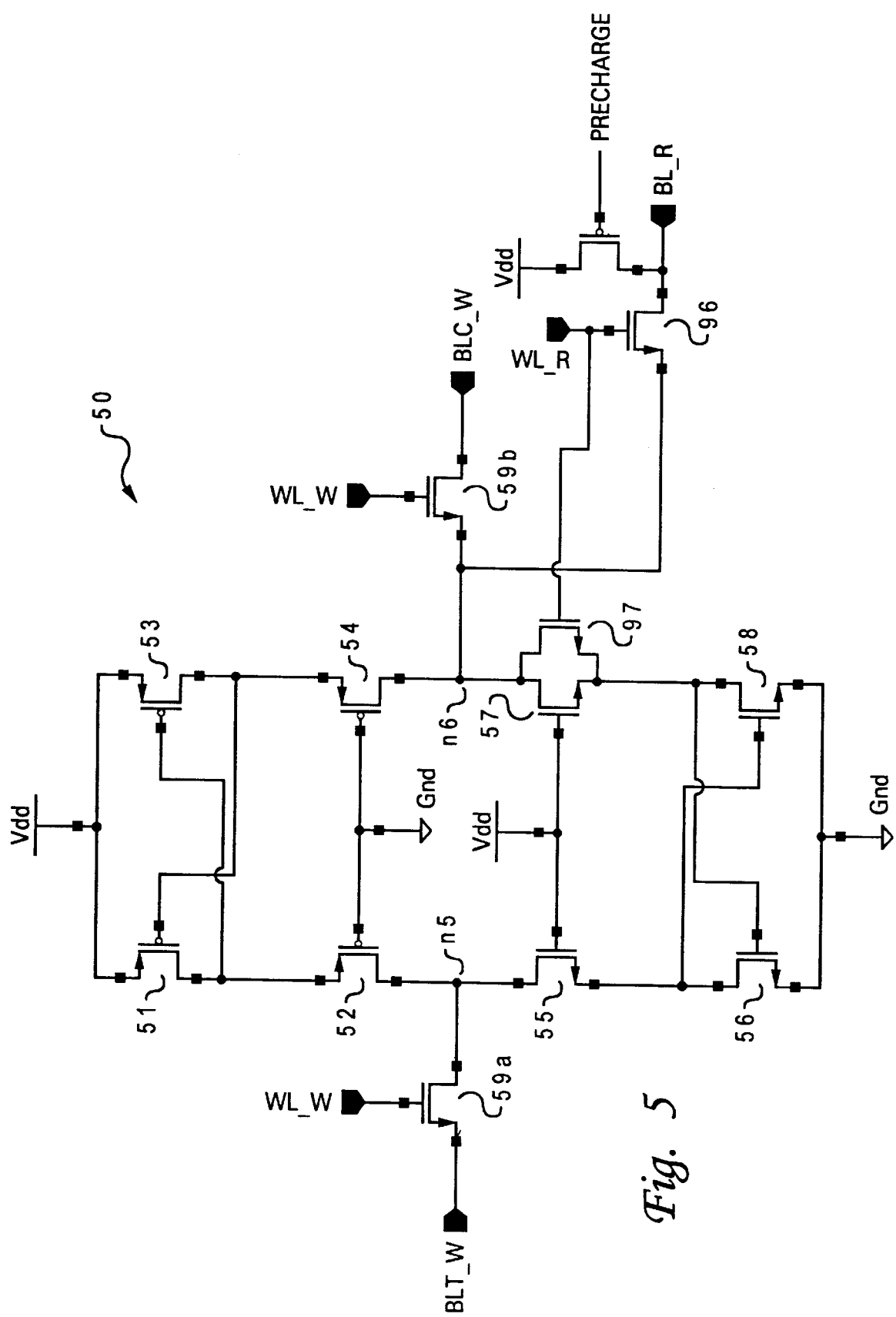
FIG. 5 is a schematic diagram of a register file cell within the register file from FIG. 1, in accordance with a third embodiment of the present invention.

Referring now to FIG. 5, there is depicted a schematic diagram of a register file cell within register file 10, in accordance with a third embodiment of the present invention. Similar to register file cell 30 in FIG. 3, register file cell 50 includes p-channel transistors 51–54 and n-channel transistors 55–58. Transistors 51, 52, 55, and 56 are connected in series, with the source of transistor 51 connected to a power supply, $V_{dd}$, and the source of transistor 56 connected to ground. Similarly, transistors 55, 54, 57, and 58 are connected in series, with the source of transistor 53 connected to $V_{dd}$ and the source of transistor 58 connected to ground. In addition, transistors 51, 52 are cross-coupled to transistors 53, 54, and transistors 55, 56 are cross-coupled to transistors 57, 58. The gates of transistors 52 and 54 are connected to a low voltage such as ground, and the gates of transistors 55 and 57 are connected to a high voltage such as a power supply.

Also shown in FIG. 5 are two n-channel pass transistors 59a and 59b. Pass transistor 59a, having its gate connected to a write wordline WL_W, is coupled between a write bitline BLT_W and a node n5. Similarly, pass transistor 59b, also having its gate connected to write wordline WL_W, is coupled between a write bitline BLC_W and a node n6. The voltage signal on write bitline BLT_W is complementary to the voltage signal on write bitline BLC_W. When enabled, pass transistors 59a and 59b allow data to be written to node n5 and node n6 from bitlines BLT_W and BLC_W, respectively. Pass transistors 59a, 59b are enabled by wordline WL_W, which has a state that is a function of the row address in a register file, as is understood by those skilled in the relevant art.

In addition, a transistor 96, having its gate connected to a read wordline WL_R, is connected between a read bitline BL_R and node n6. The gate of transistor 96 is also connected a gate of transistor 97 that is connected in parallel with transistor 57. The parallel connection between transistor 57 and transistor 97 improves the current sinking capability of transistor 96 such that the fall time of read bitline is enhanced. When enabled, transistor 96 allows data to be read from node n6 of register file cell 50 to read bitline BL_R. Transistor 96 is enabled by read wordline WL_R, which has a state that is a function of the row address in register file 10, as is understood by those skilled in the relevant art.

Figure 6:
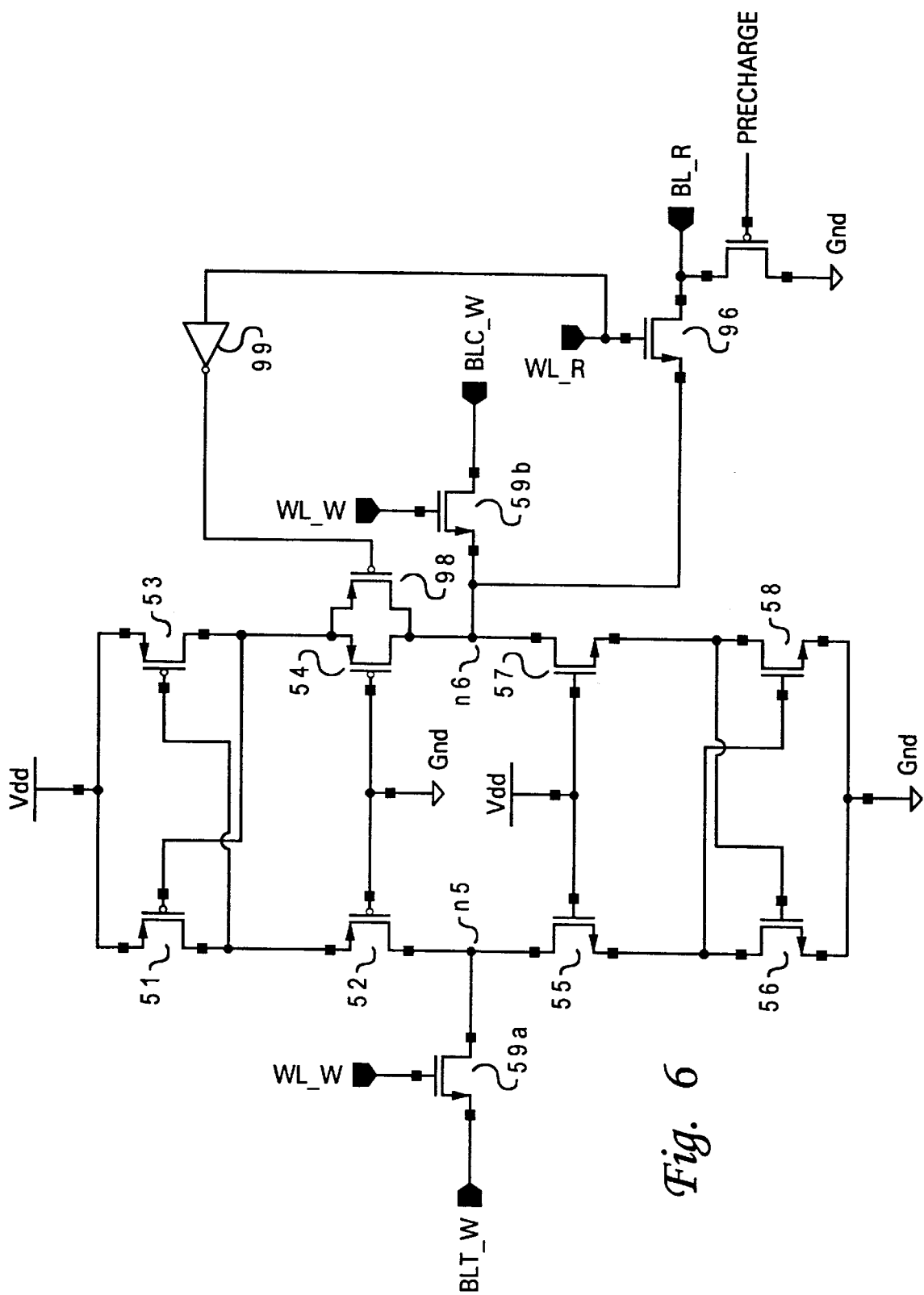
FIG. 6 is a schematic diagram of a register file cell within the register file from FIG. 1, in accordance with a forth embodiment of the present invention.

Circuit 50 in FIG. 5 can be modified by changing the parallel connection to a p-channel transistor as shown in FIG. 6. In FIG. 6, the parallel connection is accomplished by connecting a p-channel transistor 98 to transistor 54. Further, an inverter 99 is added between transistor 98 and transistor 96 to maintain polarity consistency.

As has been described, the present invention provides a SEU hardened register file cell to be utilized in register files within an integrated circuit. With the present invention, all the SEU sensitive nodes in register file cell 20 from FIG. 2 have been eliminated. All the transistors depicted in the present invention are preferably field effect transistors (FETs) fabricated with the bulk complementary-metal-oxide semiconductor (CMOS) or any other applicable processing technology that is known to those skilled in the relevant art. Except for register file cell 50 as disclosed in FIG. 5, it is understood the eight-transistor SEU hardened register file cell as disclosed in FIGS. 3 and 4 (i. e., transistors 31–38 in FIG. 3 and transistors 41–48 in FIG. 4) can be substituted by any other SEU hardened register file cell that is well-known in the art.

While the invention has been particularly shown and described with reference to a preferred embodiment, it will be understood by those skilled in the art that various changes in form and detail may be made therein without departing from the spirit and scope of the invention.

What is claimed is:

1. A register file cell capable of simultaneously reading data from and writing data to a storage cell, comprising:
   a storage cell for storing data, wherein said storage cell includes:
      a first set of two cross-coupled transistors and a second set of two cross-coupled transistors, wherein said cross-coupling is accomplished by connecting a gate of each transistor to a drain of another transistor in a same set; and
      a first set of isolation transistors and a second set of isolation transistors, wherein said first and second sets of isolation transistors are respectively connected to said first and second sets of cross-coupled transistors such that two inversion paths are formed including said two sets of cross-coupled transistors and said two sets of isolation transistors;
   a write bitline, coupled to said storage cell, for inputting write data to said storage cell; and
   a read bitline, coupled to said storage cell, for outputting read data from said storage cell.

2. The register file cell according to claim 1, wherein said first set of cross-coupled transistors includes two p-channel transistors, and said second set of cross-coupled transistors includes two n-channel transistors.

3. The register file cell according to claim 1, wherein said first set of isolation transistors includes two p-channel transistors having their gate connected to a low voltage.

4. The register file cell according to claim 3, wherein said low voltage is ground.

5. The register file cell according to claim 1, wherein said second set of isolation transistors includes two n-channel transistors having their gate connected to a high voltage.

6. The register file cell according to claim 5, wherein said high voltage is a voltage from a power supply.

7. The register file cell according to claim 1, wherein said register file cell further includes an inverter and an n-channel transistor connected between said storage cell and said read bitline for outputting read data from said storage cell.

8. The register file cell according to claim 1, wherein said register file cell further includes a single n-channel transistor connected between said storage cell and said read bitline for outputting read data from said storage cell.

9. The register file cell according to claim 1, wherein said register file cell further includes a single n-channel transistor connected between said storage cell and said read bitline for outputting read data from said storage cell, wherein a gate of said single n-channel transistor further connected to a transistor within said second set of isolation transistors.

10. A register file cell capable of simultaneously reading data from and writing data to a storage cell, comprising:
a storage cell for storing data, wherein said storage cell includes:
a first transistor cross-coupled to a second transistor;
a third transistor cross-coupled to a fourth transistor;
a first isolation and a second isolation transistors connected in series between said first transistor and said third transistor to form a first inversion path with said second transistor and said fourth transistor;
a third isolation and fourth isolation transistors connected in series between said second transistor and said fourth transistor to form a second inversion path with said first transistor and said third transistor;
a write bitline, coupled to said storage cell, for inputting write data to said storage cell; and
a read bitline, coupled to said storage cell, for outputting read data from said storage cell.

11. The register file cell according to claim 10, wherein said first transistor and said second transistor are p-channel transistors, and said third transistor and said fourth transistor are n-channel transistors.

12. The register file cell according to claim 10, wherein each of said first and third isolation transistors is a p-channel transistor having its gate connected to a low voltage, wherein each of said second and fourth isolation transistor n-channel transistors having their gate connected to a high voltage.

13. The register file cell according to claim 12, wherein said low voltage is ground and said high voltage is a voltage from a power supply.

14. The register file cell according to claim 10, wherein said register file cell further includes an inverter and an n-channel transistor connected between said storage cell and said read bitline for outputting read data from said storage cell.

15. The register file cell according to claim 10, wherein said register file cell further includes a single n-channel transistor connected between said storage cell and said read bitline for outputting read data from said storage cell.

16. The register file cell according to claim 10, wherein said register file cell further includes a single n-channel transistor connected between said storage cell and said read bitline for outputting read data from said storage cell, wherein a gate of said single n-channel transistor further connected to a transistor within said second set of isolation transistors.

17. An apparatus, comprising:
a control line; and
a register file having a plurality of register file cells, wherein each of said plurality of register file cells is capable of simultaneously reading data from and writing data to a storage cell, wherein each of said register file cells includes:
a storage cell for storing data, wherein said storage cell includes:
a first set of two cross-coupled transistors and a second set of two cross-coupled transistors, wherein said cross-coupling is accomplished by connecting a gate of each transistor to a drain of another transistor in a same set; and
a first set of isolation transistors and a second set of isolation transistors, wherein said first and second sets of isolation transistors are respectively connected to said first and second sets of cross-coupled transistors such that two inversion paths are formed including said two sets of cross-coupled transistors and said two sets of isolation transistors;
a write bitline, coupled to said storage cell, for inputting write data to said storage cell; and
a read bitline, coupled to said storage cell, for outputting read data from said storage cell.

18. The apparatus according to claim 17, wherein said first set of cross-coupled transistors includes two p-channel transistors, and said second set of cross-coupled transistors includes two n-channel transistors.

19. The apparatus according to claim 17, wherein said first set of isolation transistors includes two p-channel transistors having their gate connected to a low voltage.

20. The apparatus according to claim 19, wherein said low voltage is ground.

21. The apparatus according to claim 17, wherein said second set of isolation transistors includes two n-channel transistors having their gate connected to a high voltage.

22. The apparatus according to claim 21, wherein said high voltage is a voltage from a power supply.

23. The apparatus according to claim 17, wherein said register file cell further includes an inverter and an n-channel transistor connected between said storage cell and said read bitline for outputting read data from said storage cell.

24. The apparatus according to claim 17, wherein said register file cell further includes a single n-channel transistor connected between said storage cell and said read bitline for outputting read data from said storage cell.

25. The apparatus according to claim 17, wherein said register file cell further includes a single n-channel transistor connected between said storage cell and said read bitline for outputting read data from said storage cell, wherein a gate of said single n-channel transistor further connected to a transistor within said second set of isolation transistors.

* * * * *